United States Patent [19]

Kruchowski et al.

[11] Patent Number: 5,162,743
[45] Date of Patent: Nov. 10, 1992

[54] METHOD AND APPARATUS FOR OPTIMIZING THE ELECTRICAL LENGTH OF A SIGNAL FLOW PATH

[75] Inventors: James N. Kruchowski, Eau Claire; Melvin C. August, Chippewa Falls; John B. Eder, Eau Claire, all of Wis.

[73] Assignee: Cray Research, Inc., Chippewa Falls, Wis.

[21] Appl. No.: 611,899

[22] Filed: Nov. 9, 1990

[51] Int. Cl.$^5$ .................................. G01R 27/02
[52] U.S. Cl. ................................. 324/617; 324/533; 324/605
[58] Field of Search ............. 324/637, 642, 644, 527, 324/532, 533, 534, 535, 543, 603, 604, 605, 617; 333/139, 138

[56] References Cited

U.S. PATENT DOCUMENTS

| | | | |
|---|---|---|---|
| 3,204,180 | 8/1965 | Bray et al. | 324/617 X |
| 3,564,403 | 2/1971 | Schwarz | 324/543 |
| 4,041,395 | 8/1977 | Hill | 324/642 X |
| 4,269,397 | 5/1981 | Strimple et al. | 266/44 |
| 4,484,131 | 11/1984 | Jenkinson | 324/533 |
| 4,734,637 | 3/1988 | Chen et al. | 324/642 |
| 4,749,936 | 6/1988 | Taplin | 324/644 |
| 4,814,689 | 3/1989 | Obara | 324/644 X |

FOREIGN PATENT DOCUMENTS 1404744 9/1975 United Kingdom.

*Primary Examiner*—Jack B. Harvey
*Attorney, Agent, or Firm*—Merchant, Gould, Smith, Edell, Welter & Schmidt

[57] ABSTRACT

Apparatus and method for determining the electrical length of a signal flow path, such as a twisted-pair conductor, to create conductors of the same electrical length are disclosed. The term electrical length refers to a certain physical distance for a length of conductor for which an electrical signal travels, or propagates along the conductor, in a specified amount of time. The apparatus preferably includes a Time Domain Reflectometer 25 (including pulse generator means 30 and electrical response display means 20) which is cooperatively connected to a first end of a conductor pair 51 under test. The conductor pair 51 is inserted through a ground plane 60 or other impedance changing device. Means to mark or cut 62 the conductor 51 are located within the ground plane 60 or as close as possible to the point at which the impedance is changed. Processing means 40 are utilized to adjust the conductor 51 length relative to the ground plane 60. In operation, the pulse generator means 30 sends a pulse along the conductor 51. The ground plane 60 reflects a portion of the pulse back to the electrical response display means 20 with the signal propagation delay per unit mechanical length being calculated thereby.

19 Claims, 4 Drawing Sheets

METHOD AND APPARATUS FOR OPTIMIZING THE ELECTRICAL LENGTH OF A SIGNAL FLOW PATH

FIELD OF THE INVENTION

This invention relates generally to signal flow paths, and more specifically to determining and optimizing the electrical delay caused by a length of wire in order to improve the operating clock window of a high speed computer.

BACKGROUND OF THE INVENTION

Since the invention of transistors, digital circuits have revolutionized not only the electronics industry, but all walks of life which use or depend upon an electronic switching function for control and/or operation of an electrical circuit. The transistor, in digital applications, essentially operates as an "on/off" switch. This contrasts with analog circuits which operate on the basic principles of measuring and multiplying the actual real-time value of electrical signals.

Digital circuits typically operate in response to series or combinations of "binary" or "logical" signal levels. While the digital signals may assume a plurality of different levels or operative states, for simplicity, most digital systems operate in a simple "two-level" or "binary" logical manner. Simply stated, the digital signal assumes either a "logical one" or a "logical zero" state or level.

When digital logic circuits are combined with memory elements (e.g., flip flops among others), the system is described in terms of "sequential logic." A sequential logic circuit may be specified by a time sequence of inputs, outputs and internal states. Digital circuits are typically categorized as one or two types. The first type is known as an asynchronous circuit. In an asynchronous circuit, the output behavior of the circuit depends upon the order in which its input circuits change. The second type of sequential logic circuit is known as a synchronous circuit. In this latter type of circuit, the output may be defined from the knowledge of the circuit's input signals which affect the system's memory elements solely at discrete intervals of time. The preferred method by which this goal is achieved, is to utilize binary signals in a periodic train of "clock pulses." The clock pulses are typically distributed throughout the system in such a way that memory elements are affected by input signals solely in combination with the arrival of the synchronization clock pulse.

With the utilization of faster computers utilizing sequential logic, the timely distribution of clock pulses and other signals throughout the system becomes critical. For example, if the clock pulse becomes delayed, then a signal acting on the memory element may no longer be present, or may otherwise be changed by the time that the clock pulse reaches the memory element. Under these circumstances, the synchronous circuit may act in an unpredictable and/or undesirable manner. While the example of a delayed clock pulse will be illustrated herein, other signals which are dependent upon or otherwise affect timing might also benefit from utilization of the present invention. The present invention is not to be construed as limited by the examples presented herein.

Due to differences in the electrical characteristics of the various signal flow paths in a computer, the propagation speed of electrical signals via similar physical lengths of the signal flow paths varies. These differences often occur even in similar types of flow paths and even in the same type of flow paths originating from the same stock. Over the entire length of any individual signal flow path, the variation can create an unacceptable delay by causing a large difference in the time required for distribution of the clock pulses throughout the system. Therefore, continuing further with the illustration of distributed clock pulses, the variation may cause designers to expand the designed clock window of the system. More specifically, since the propagation time varies over the signal flow paths within the computer, the system designer must infer the longest propagation time when designing the system. However, as noted, even signal flow paths from the same stock exhibit a variance in electrical signal propagation time. Therefore, the clock window must be expanded further by the electrical propagation time tolerances of the signal flow path. As those skilled in the art will appreciate, by expanding the window, the computer is, in essence, forced to run slower.

Previously signal flow paths were cut to a nominal mechanical/physical length, however, due to the above described propagation delays from the electrical differences in the signal flow paths, there arises a need for a method and apparatus to create physical lengths of signal flow paths having an equal electrical length. Therefore, there arises a need for a method and apparatus for determining, selecting and optimizing the electrical length of a signal flow path.

SUMMARY OF THE INVENTION

The present invention provides a simple, relatively inexpensive, and yet reliable method and apparatus for automatically determining the electrical length of a signal flow path (hereinafter referred to as "conductor" for convenience), such as a twisted-pair conductor, so as to create conductors of the same electrical length. As used herein, the term "electrical length" refers to a certain physical distance for a length of a conductor for which an electrical signal travels, or propagates, along that conductor in a specified amount of time.

In a preferred embodiment constructed according to the principles of the present invention, a nominal physical length of a conductor, or unknown electrical length, is inserted through an aperture formed through a ground plane. As those skilled in the art will recognize, the ground plane changes the impedance of the conductor at the point that the ground plane and wire intersect. The first end of the conductor (i.e., that end drawn through the ground plane) is connected to a time domain reflectometer, or "TDR" (including pulse generator means and electrical response display means). The second end of the conductor may be defined as that point of the conductor at which the ground plane intersects the conductor. A pulse is then applied to the first end of the conductor and the delay of the returning pulse is measured, wherein the pulse is reflected back to the first end by the ground plane. The electrical response display means is used to determine the delay. The mechanical length of a conductor is then adjusted back and forth (relative to the first end of the conductor and the ground plane) so as to result in a desired physical length extending through the ground plane and thereby the desired delay. Means for cutting the conductor at a known location at the ground plane, or proximate the second end, are provided so as to form the specific electrical length. As used herein "mechanical length" refers to an actual physical length or distance of conductor.

Therefore, according to one aspect of the invention there is provided a method of automatically determining the electrical delay length of a physical length of a signal flow path comprising the steps of placing the physical length of the signal flow path through an aperture in a ground plane to a desired approximate physical length, wherein the signal flow path has a first end and a second end; connecting the first end to a pulse generator; applying a pulse to the first end; measuring the delay of the reflected pulse; adjusting the physical length of signal flow path to create the desired electrical delay; and cutting the signal flow path to the desired electrical length.

According to another aspect of the invention, there is provided an apparatus for determining a constant propagation time interval in a varying length of physical conductor, comprising;

(a) signal generation means, cooperatively connected to the conductor, for generating an impulse signal;
(b) impedance changing means, said impedance changing means located proximate the conductor, wherein the impedance of the conductor is changed;
(c) signal analysis means, cooperatively connected to the conductor, for analyzing the delay of said impulse signal along the conductor; and
(d) reference means for marking the conductor at the desired electrical length.

Still further, according to another aspect of the invention, there is provided an apparatus for optimizing the propagation time of an electrical signal along a length of physical conductor having two ends comprising: (a) signal generation means, cooperatively connected to the conductor, for generating a signal; (b) impedance changing means, said impedance changing means located proximate the conductor and between the ends of the conductor, wherein the impedance of the conductor is changed and at least a portion of said generated signal is thereby reflected; (c) processor means, cooperatively connected to the conductor for determining the delay of the reflected signal in accordance with the following equation:

$$t_{pd} = 1/((C)(\epsilon_R)^{\frac{1}{2}})$$

where $t_{pd}$=time of propagation delay, $C=11.81\times 10^9$ inches per second (speed of light), and $\epsilon_R$=relative dielectric constant of the transfer medium; and (d) reference means for adjusting the location of said impedance changing means along the length of the conductor, whereby the length of conductor exhibiting the optimum propagation time delay may be determined.

While the invention will be described with respect to a preferred embodiment configuration and with respect to particular components used therein, it will be understood that the invention is not to be so construed as limited in any manner by either circuit configurations, logic flow diagrams or components described herein. Also, while particular types of signal flow paths (i.e., such as twisted-pair conductors) will be described with respect to the description of a preferred embodiment of the invention, it will be understood that such particular signal flow paths are not to be construed in a limiting manner. Further, while the preferred embodiment of the invention will be described in relation to interconnection of sequential logic in a computer, it will be understood that the scope of the invention is not to be limited in any way by the logic flow path or the computer environment in which it is employed. The principles of this invention apply to the determination and creation of an electrical length of a signal flow path so as to properly provide for a proper delay, or optimization of a delay, of a signal along the signal flow path. These and other variations of the invention will become apparent to those skilled in the art upon a more detailed description of the invention.

It will further be appreciated that the principles of this invention apply not only to the components used to implement the invention, but also to the method, in general, of automatically providing for optimizing electrical lengths of signal flow paths.

These and various other advantages and features which characterize the invention are pointed out with particularity in the claims annexed hereto and forming a part hereof. However, for a better understanding of the invention, it advantages and objectives obtained by its use, reference should be had to the drawing which forms a part hereof and to the accompanying descriptive matter, in which there is illustrated and described a preferred embodiment of the invention.

BRIEF DESCRIPTION OF THE DRAWING

Referring to the Drawing, wherein like numerals represent like parts throughout the several views.

DETAILED DESCRIPTION OF THE PREFERRED EMBODIMENT

Figure 1:
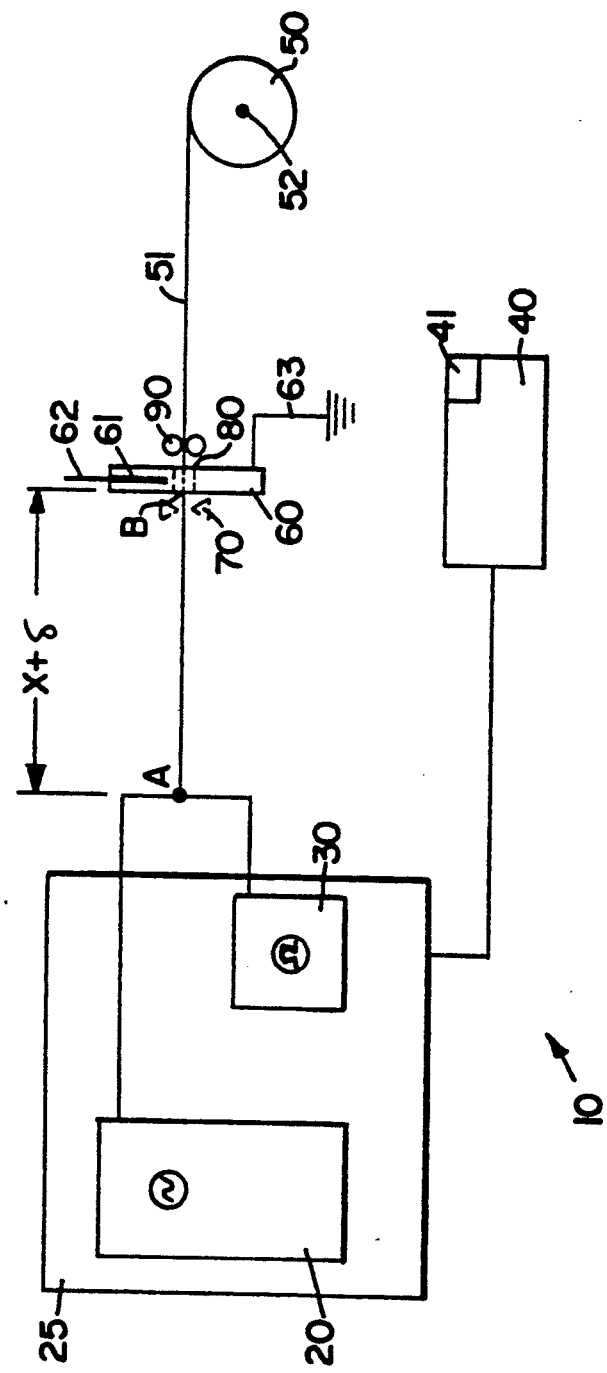
FIG. 1 is a schematic diagram illustrating the various components utilized to practice the present invention in a preferred manner.

As mentioned above, the principles of this invention apply to the optimization of conductor length so as to establish an optimal propagation delay. This invention provides a method and apparatus for automatically insuring that the electrical length of a conductor is within the propagation tolerance of a clock window. A preferred application for this invention is in the establishing of an electrical length of a signal path for conductors in a high speed computer. Such application is typical of only one of the innumerable types of application in which the principles of the present invention can be employed.

In the preferred application of the invention, a typical high speed computer clock speed may be on the order of 6 nanoseconds. The clock window, or that period in which the clock pulse must reach the various memory elements, is thereby, typically, on the order of 300 picoseconds.

At the foregoing speeds, the propagation delay of the clock pulse along the various signal flow paths becomes significant. By way of example, if the propagation delay of a twisted pair conductor is approximately 120 picoseconds per inch, then in a sixty (60) inch conductor, the total delay is 7200 picoseconds. However, due to changes in the dielectric, the delay per inch may vary by plus or minus 4 picoseconds per inch. Therefore, over the course of a 60 inch conductor there may be a variation of as much as plus or minus 240 picoseconds. Since the assumed delay is 120 picoseconds per inch, by cutting (or adding) up to two inches of physical length, the electrical length may be optimized to a nominal electrical delay. As will become apparent upon a more detailed description of the preferred embodiment of the invention, the method and apparatus of this invention can be employed to optimize the electrical length to accommodate the varying electrical characteristics of a plurality of various signal flow paths.

As those skilled in the art will appreciate, the propagation delay per unit of mechanical length for a pulse in a twisted pair wire may be determined in accordance with Maxwell's Equations:

$$\epsilon \int E \cdot dS = q \quad (1)$$

$$\int \beta \cdot dS = o \quad (2)$$

$$\int \beta \cdot dl = \mu_o(i + \epsilon d\phi E/dt) \quad (3)$$

$$\int E \cdot dl = d\phi \mu_\mu / dt \quad (4)$$

For a general propagation path, Maxwell's equations with respect to propagation delay may be simplified to:

$$t_{pd} = 1/((c)(\epsilon_r)^{\frac{1}{2}}) \quad (5)$$

where $t_{pd}$ = time of propagation delay,
$c = 11.81 \times 10^9$ in/sec (speed of light), and
$\epsilon_r$ = relative dielectric constant of the transfer medium.

Further, for transmission lines (or in the present case conductors) the amplitude of the reflected pulse seen at the source is related to the reflection coefficient. The reflection coefficient for any change in characteristic impedance seen along a transmission line is defined as follows:

$$\rho L = (Z_L - Z_o)/(Z_L + Z_o) \quad (6)$$

where $Z_L$ = the characteristic impedance of the changed section; and
$Z_o$ = the characteristic impedance of the transmission line itself.

Once the reflection coefficient is defined, the amplitude of the reflected pulse seen by the signal analyzer (or oscilloscope) at the first end of the transmission line is related to the amplitude of the transmitted pulse as follows:

$$V_{reflected\ pulse} = V_{source} * \rho L \quad (7)$$

In the preferred embodiment, a square pulse is utilized to propagate down the conductor. An ideal pulse may be defined as follows:

$$f_\Sigma(t) = 1, o \leq t \leq \Sigma$$
$$o, t > \Sigma$$

A simple measurement of the time difference between the pulse and the return of the pulse divided by 2 (i.e., the time the pulse travels down the conductor to the ground plane and back to the first end of the conductor) divided by the known mechanical length provides a propagation delay for that conductor per unit of mechanical length.

The conductor may then be cut to the desired electrical distance either solely by the calculated delay or, alternatively, by physically measuring the conductor utilizing the given propagation delay per unit of mechanical length.

Referring first to FIG. 1 there is illustrated generally at 10 an apparatus for optimizing the electrical length of a signal flow path. The apparatus includes a time domain reflectometer ("TDR") system 25. TDR 25 includes an electrical signal analysis means or oscilloscope device 20 and a wave generation device 30. TDR 25 is cooperatively connected to conductor 51 at point A in FIG. 1. Preferably an electrical and physical connection are made simultaneously. Any number of connector type devices may be utilized, as those skilled in the art will appreciate, one example being a pressure type connector. Conductor 51 is threadably inserted through an aperture 80 formed through ground plane 60 (best seen in FIG. 5). Preferably, a guillotine type cutting blade 62 is inserted through the center of block 60. Block 60 includes a slot 61 formed therein to accommodate the guillotine blade 62. Preferably the slot 61 is wide enough only to accommodate the blade 62. Alternatively, a cutting means 70 may be included as close to the block face as possible. Those skilled in the art will recognize that while a metal block ground plane 60 is preferably used, other devices which artificially change the impedance of the conductor so as to cause a reflection in the pulse propagating down the conductor 51 may similarly be utilized. For example, by constricting the conductor 51, the impedance may be changed.

The width of the block 60 is preferably designed in accordance with the accuracy of TDR 25. In the preferred embodiment, TDR 25 is a digital sampling model manufactured by Tectronix, Inc. of Beaveron, Oregon having model number designation of 11801. As those skilled in the art will appreciate, with these and other TDR 25 equipment, it is difficult to consistently measure electrical impedance changes of less than 60 picoseconds. At a nominal conductor propagation delay per unit of mechanical length of 120 picoseconds per inch, as in the preferred embodiment, the block 60 should, therefore, be one-half inch or greater in thickness.

Aperture 80 (best seen in FIG. 5) is preferably sized and configured to the size conductor 51 to be measured. The relationship between the aperture 80 size and diameter of the conductor 51 will be described further below.

Still referring to FIG. 1, ground plane block 60 is grounded with a ground strap 63 which is as short and wide as possible to reduce resistance and inductance. Further, the ground plane 60 is preferably made of aluminum, although those skilled in the art will recognize that any other material which is conductive and resists wear from the wire 51 and guillotine blade 62 might be utilized. Wire 51 is pulled along by rollers 90 from wire reel stock 50 which rotates about a center axis 52.

In a preferred embodiment of a device constructed according to the principles of the present invention, logic means 40 may be utilized to sequentially advance the twisted pair conductor 51 to a nominal mechanical length (illustrated in FIG. 1 as a distance "X"), determine the propagation delay, adjust for electrical length (i.e., $X+\delta$), and cut the conductor 51 at a preferred electrical length. The logic means 40 includes a controller or microprocessor 41, which may preferably be any one of a number of readily available personal computers with appropriate I/O boards.

Figure 2:
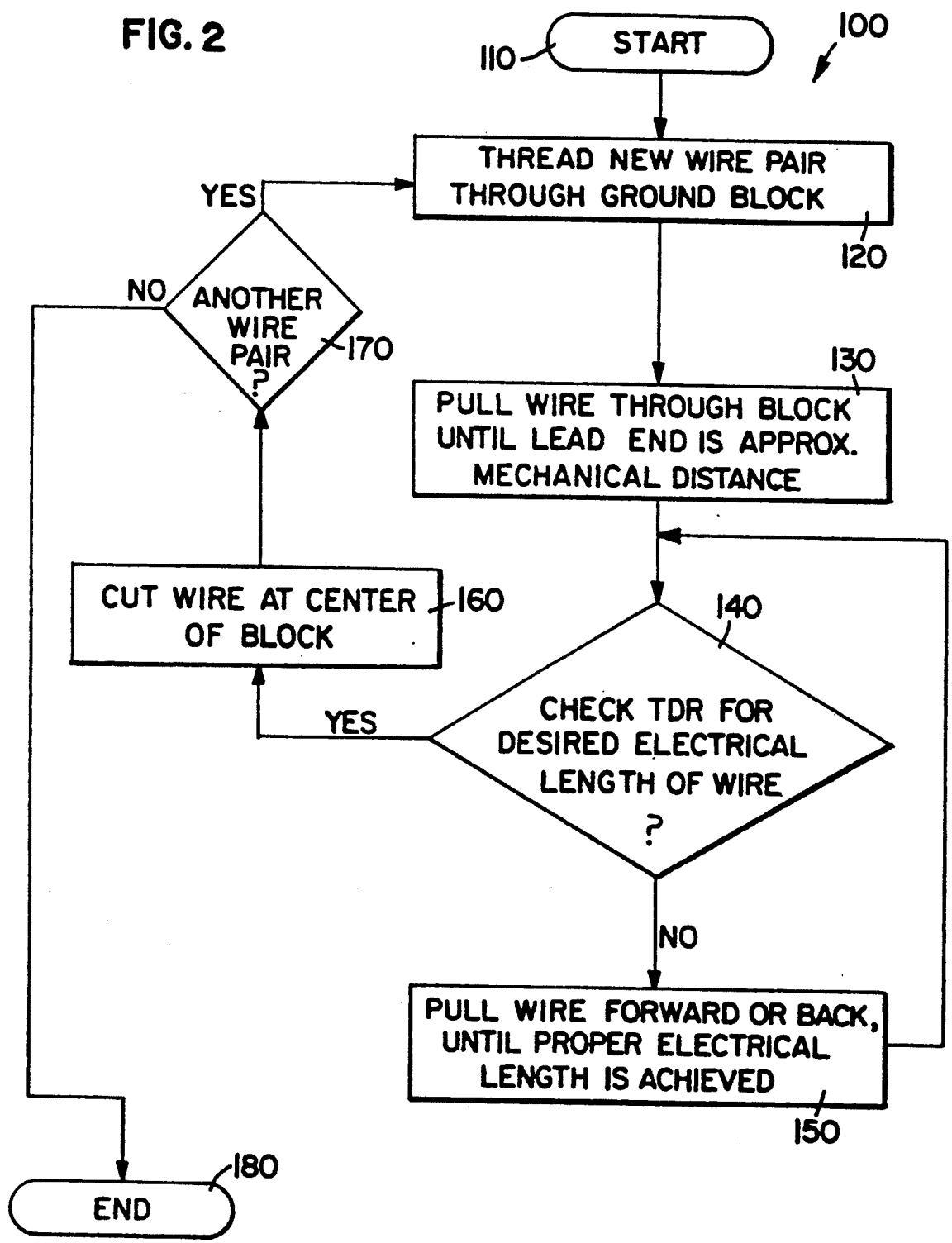
FIG. 2 is a logic flow diagram illustrating the various steps to perform the present invention in a preferred manner.

A logic flow diagram of an embodiment of the program logic which might be resident in microprocessor 41 is illustrated in FIG. 2, wherein the logic diagram is shown generally at 100. The logic flow diagram 100 illustrates the steps taken to analyze the logical status of the electrical length illustrated in FIG. 1 as $X+\delta$.

Although the controller 41 will be characterized as "proceeding" from logical block to logical block, while describing the operation of the program logic, those skilled in the art will appreciate that programming steps are being acted on by microprocessor 41.

In operation, controller 41 starts at block 110. Controller 41 then proceeds to drive the appropriate rollers 90 to thread the next conductor 51 pair through the grounded metal block 60 at block 120. Proceeding to block 130, the conductor 51 is pulled a nominal distance X which approximates the desired mechanical length. Simultaneously at block 130, the leads to conductor pair 51 are connected to TDR 25 at point A.

The controller 41 then continues to block 140 by checking the output of the TDR 25 for the desired electrical length of conductor. In the event that the conductor 51 is not the proper electrical length, the controller 41 proceeds to block 150 at which time rollers 80 are driven backward and/or forward corresponding to the proper electrical length $X+\delta$, and the process of adjusting at block 150 and testing at block 140 are repeated until the proper electrical length is achieved.

In the event that the original mechanical length X of conductor 51 is also the desired electrical length of conductor 51 at block 140, controller 41 proceeds to block 160 directly. After the proper electrical length is achieved, the controller proceeds from block 150 to block 160 via block 140.

At block 160, the conductor 51 is cut by the guillotine style cutter 62 in the center of block 60 and the conductor 51 is disconnected from TDR 25.

The controller 41 then moves to block 170 to determine if another conductor 51 measurement is desired. If another electrical length is desired, then controller 41 proceeds again to block 120. If another conductor pair is not desired, then the controller 41 proceeds to end block 180.

Those skilled in the art will recognize that the software logic routine may be interrupt driven or may be part of a main program.

Figure 3:
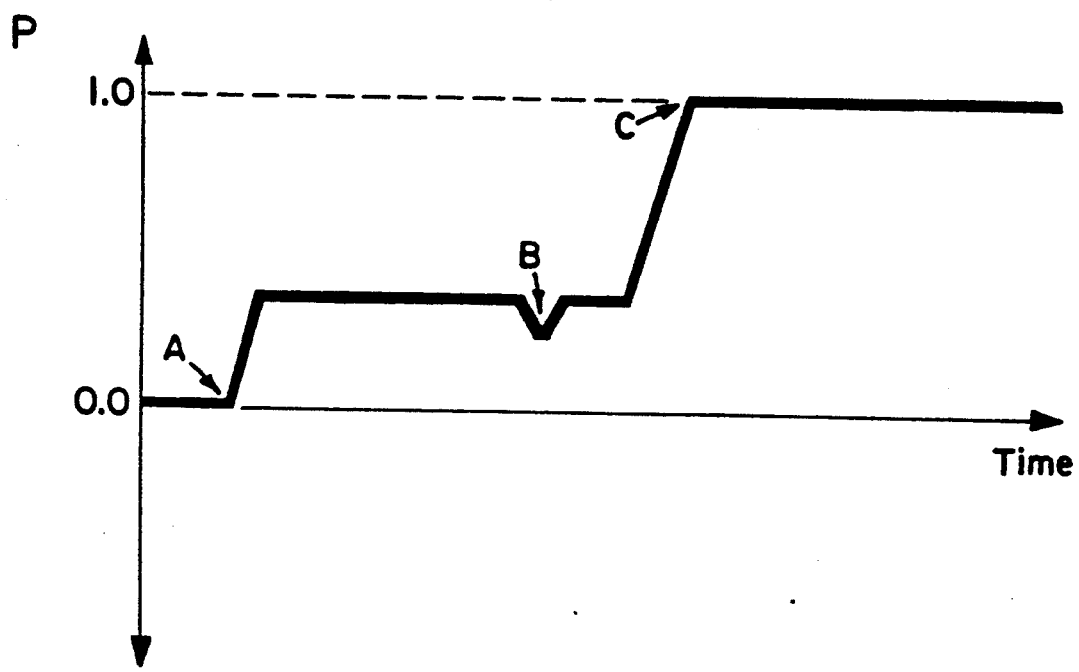
FIG. 3 is a sample curve of electrical response of a conductor versus time after an ideal pulse is applied to the conductor.

Turning next to FIG. 3, an example of the relative reflection coefficients encountered along a transmission line, generally, or the conductor 51 more specifically, are plotted as a function of time. As those skilled in the art will appreciate, point A is located at the reflection coefficient change at the beginning of the conductor 51. Point B is that point at which the reflection coefficient changes due to an artificial change in impedance, in the preferred embodiment preferably a ground block 60 or plane (best seen in FIGS. 1 and 5). Point C is located at the change due to the open circuit at the end of the conductor 51. It will be appreciated by those skilled in the art that the delay time between points A and B is twice the electrical delay of the conductor 51. Further, the time between points A and C is twice the delay to the end of the conductor 51. FIG. 3 is unscaled and is provided for the purpose of illustration only.

In a preferred embodiment, subminiature twisted pair wire was evaluated to determine propagation time delays and creating nominal electrical lengths. The wire specifications were as follows: the wire was 34 AWG made of silver plated copper, having a dielectric of PTFE (0.016 inch nominal diameter). The conductor is twisted with $4.0\pm0.5$ twists per inch and has an overall diameter of 0.32 inch. Electrically, the conductor's impedance is 120 ohms$\pm$12 ohms (measured differentially) with a capacitance of 13 pF/Ft nominal and a 1.35 nanosecond/foot delay.

Generally, those skilled in the art will appreciate that many factors influence the impedance of a conductor. For example, twists per inch, compression between conductors, manufacturing concerns, and the dielectric constant of the insulating material all affect the impedance of a twisted-pair flow path. Also, those skilled in the art will appreciate that as the reflective dielectric constant varies, the delay varies as the square root (see equation 5 above).

Figure 4:
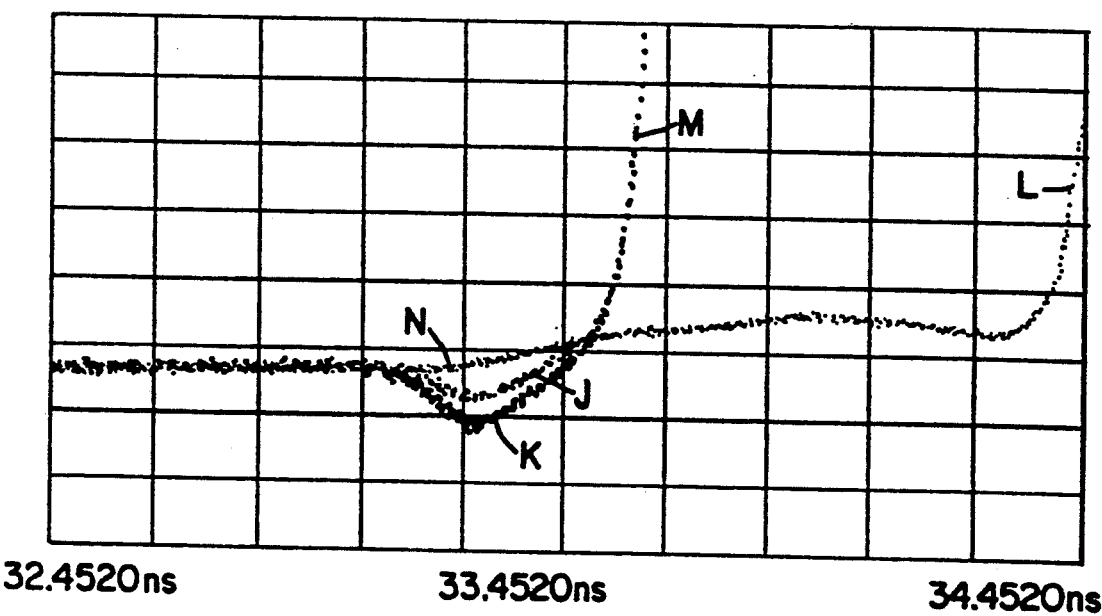
FIG. 4 is a graph illustrating the variation of response of the impulse for changes in size of the aperture in the ground plane of block 40 for a given gauge of conductor 51 of FIG. 1.
Figure 5:
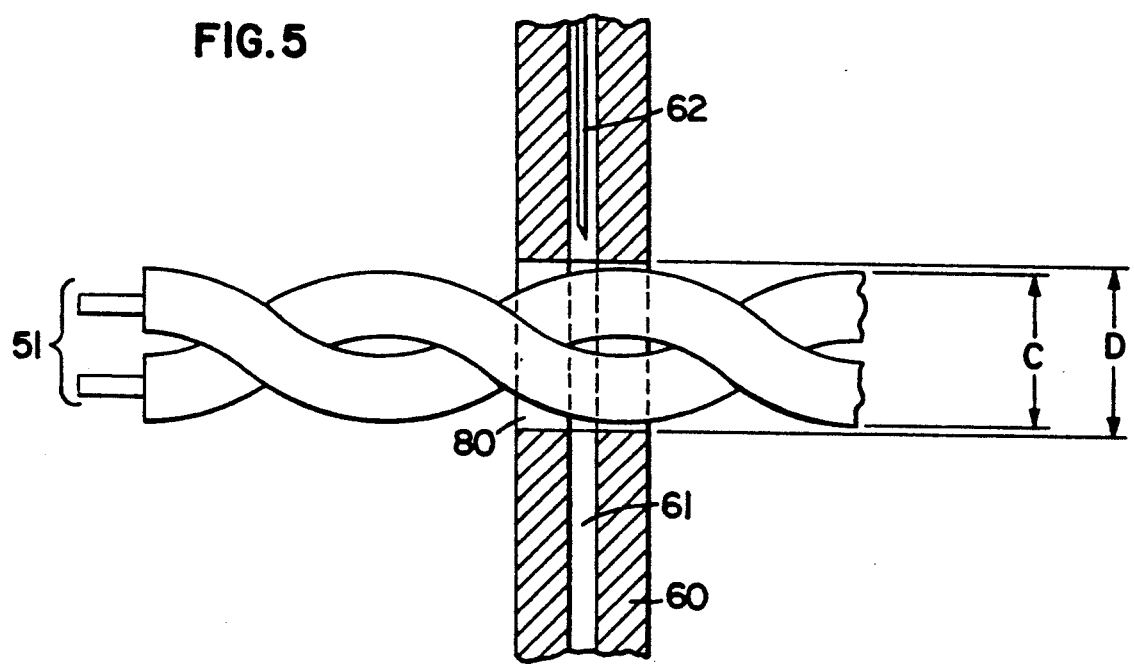
FIG. 5 is an enlarged cross-sectional view taken through block 40 of FIG. 1.

Referring now to FIGS. 4 and 5, the relationship between the diameter of the conductor 51 and the aperture 80 in the ground block 60 is illustrated. As demonstrated in FIG. 4, the aperture 80 size (denoted as "D" in FIG. 5) should closely approximate the outside diameter of the conductor 51 (denoted as "C" in FIG. 5). Preferably, the aperture 80 size is within 1 or 2 mils of the conductor 51 diameter. As illustrated in FIG. 4, if the diameter D is much larger than the diameter C, then the resolution of TDR 25 begins to decrease and the reflection of the square pulse is not as discernable. For example in FIG. 4, plot J represents a ground block 60 having an 0.044" diameter D with an 0.002" diameter clearance K represents an 0.042 diameter D with an 0.001" diameter clearance. Those skilled in the art will appreciate that the smaller the clearance, the greater change in impedance exhibited, and the greater resolution. FIG. 4 also illustrates the effect that cutting a length of conductor has on the display. Plot L illustrates an original conductor sample, while plot M illustrates the conductor after being cut approximately 8 inches. Plot N is provided as a reference for plots J and K.

While twisted pair has been set forth herein by way of example as a conductor with which the principles of this invention may be practiced, those skilled in the art will appreciate that other conductor types or styles may also be used. For example, coaxial conductors may be optimized to an electrical length if the shield is used as the positive conductor in connection with the apparatus 10 embodiment described herein. Further, multiple conductor twisted pairs might also be utilized.

In addition, while the particular embodiment of the invention has been described with respect to its application for determining and creating specific electrical lengths of a signal flow path, preferably twisted-pair conductors, it will be understood by those skilled in the art that the invention is not limited to such application or embodiment or to the particular components disclosed and described herein. It will be appreciated by those skilled in the art that other configurations that embody the principles of this invention and other applications therefor, other than as described herein, can be configured within the spirit and intent of this invention. The components described herein are provided only as an example of one embodiment that incorporates and practices the principles of this invention. Other modifications and alterations are well within the knowledge of those skilled in the art and are to be included within the broad scope of the appended claims.

What is claimed is:

1. An apparatus for optimizing the propagation time of an electrical signal along a length of physical conductor having two ends comprising:
   (a) signal generation means, cooperatively connected to one end of the conductor, for generating a signal;
   (b) impedance changing means, said impedance changing means located proximate the conductor and between the ends of the conductor, wherein the impedance of the conductor is changed and at least a portion of said generated signal is thereby reflected back to said one end;
   (c) processor means, cooperatively connected to the conductor for determining the actual delay of said reflected signal and comparing the actual delay with the optimum propagation time delay; and
   (d) reference means for automatically adjusting the location of said impedance changing means along the length of the conductor, wherein the physical length of conductor exhibiting the optimum propagation time delay is located.

2. The apparatus of claim 1, wherein said processor means includes a time domain reflectometry system.

3. The apparatus of claim 2, wherein said impedance changing means includes a ground plane having an aperture formed therethrough, wherein the conductor intersects said ground plane through said aperture.

4. The apparatus of claim 1 wherein the optimum time delay is determined in accordance with the following equation:

$$t_{pd} = 1/((C)(\epsilon_R)^{\frac{1}{2}})$$

where $t_{pd}$=time of propagation delay, $C=11.81\times10^9$ inches per second (speed of light), and $\epsilon_R$=relative dielectric constant of the transfer medium.

5. An apparatus for determining a propagation time interval in a varying length of physical conductor comprising:
   (a) signal generation means, cooperatively connected to the conductor, for generating an impulse signal;
   (b) impedance changing means, said impedance changing means located proximate the conductor, wherein the impedance of the conductor is changed;
   (c) signal analysis means, cooperatively connected to the conductor, for analyzing the delay of said impulse signal along the conductor; and
   (d) reference means for adjusting the physical length of the conductor to the desired electrical length and cutting the conductor at the desired electrical length.

6. The apparatus of claim 5, wherein said impedance changing means is a ground plane having an aperture formed therein, wherein the conductor intersects said ground plane through said aperture.

7. The apparatus of claim 6, wherein said reference means is comprised of a cutting device located proximate said ground plane.

8. The apparatus of claim 6, wherein said reference means comprises a blade, residing within said ground block.

9. The apparatus of claim 5, wherein said reference means includes control processing means for physically moving the physical conductor length relative to said ground plane so as to locate the conductor at the desired electrical length prior to cutting.

10. The apparatus of claim 6, wherein said aperture is arranged and configured to said conductor so as to closely approximate the diameter of the conductor.

11. The apparatus of claim 10, wherein the conductor is a twisted pair conductor.

12. The apparatus of claim 10 wherein the conductor is compared of multiple strand twisted wire.

13. The apparatus of claim 10, wherein the conductor is coaxial cable.

14. A method of automatically determining the electrical length of a length of conductor, comprising the steps of:
   (a) placing a length of the electrical path conductor through an aperture in a ground plane to a desired approximate physical length, wherein said ground plane causes a change impedance in the conductors at the point where the conductors intersect said ground plane;
   (b) connecting the conductors to a pulse generator;
   (c) applying a pulse to the conductors;
   (d) measuring the delay of the reflected signal caused by the change in impedance;
   (e) adjusting the physical length of the conductors relative to said ground plane to optimize the desired delay; and
   (f) cutting the physical length of conductor to the desired electrical length.

15. The method of claim 14, wherein said measuring step includes determining the delay of the reflected signal.

16. The method of claim 15, wherein the delay and the reflected signal is determined in accordance with the following equation:

$$t_{pd} = 1/((C)(\epsilon_R)^{\frac{1}{2}})$$

where $t_{pd}$=time of propagation delay, $C=11.81\times10^9$ inches per second (speed of light), and $\epsilon_R$=relative dielectric constant of the transfer medium.

17. An apparatus for optimizing the propagation time of an electrical signal along a length of physical conductor having two ends comprising:
   (a) signal generation means, cooperatively connected to the conductor, for generating a signal;
   (b) impedance changing means, said impedance changing means located proximate the conductor and between the ends of the conductor, wherein the impedance of he conductor is changed and at least a portion of said generated signal is thereby reflected;
   (c) processor means, cooperatively connected to the conductor for determining the delay of the reflected signal; and
   (d) reference means for automatically adjusting the location of said impedance changing means along he length of the conductor, whereby the length of conductor exhibiting the optimum propagation time delay may be determined and marked.

18. The apparatus of claim 15, wherein said processor means determines the delay of the reflected signal in accordance with the following equation:

$$t_{pd} = 1/((C)(\epsilon_R)^{\frac{1}{2}})$$

where $t_{pd}$=time of propagation delay, $C=11.81\times10^9$ inches per second (speed of light), and $\epsilon_R$=relative dielectric constant of the transfer medium, and wherein said processor means includes a time domain reflectometry system.

19. The apparatus of claim 18, wherein said impedance changing means includes a ground plane having an aperture formed therethrough, wherein the conductor intersect said ground plane through said aperture.

* * * * *

UNITED STATES PATENT AND TRADEMARK OFFICE
CERTIFICATE OF CORRECTION

PATENT NO. : 5,162,743
DATED : November 10, 1992
INVENTOR(S) : JAMES N. KRUCHOWSKI et al.

It is certified that error appears in the above-identified patent and that said Letters Patent is hereby corrected as shown below:

In column 5, line 28, for "$d\phi\mu_\mu/dt$" read --$d\phi\beta_\beta/dt$--.
In column 8, line 38, after "clearance" insert
    --,while plot--.
In column 10, line 16, for "compared" read --comprised--.
In column 10, line 58, for "he" read --the--.
In column 10, line 66, for "he" read --the--.
In column 12, line 7, for "intersect" read --intersects--.

Signed and Sealed this

Nineteenth Day of October, 1993

Attest:

BRUCE LEHMAN

Attesting Officer

Commissioner of Patents and Trademarks